United States Patent [19]

Abe

[11] Patent Number: 4,763,407

[45] Date of Patent: Aug. 16, 1988

[54] METHOD OF MANUFACTURING A SEMICONDUCTOR DEVICE

[75] Inventor: Takemi Abe, Fujisawa, Japan

[73] Assignee: Tokyo Shibaura Denki Kabushiki Kaisha, Kawasaki, Japan

[21] Appl. No.: 52,224

[22] Filed: May 21, 1987

Related U.S. Application Data

[62] Division of Ser. No. 573,653, Jan. 25, 1984, abandoned.

[30] Foreign Application Priority Data

Jan. 28, 1983 [JP] Japan .................................. 58-12522

[51] Int. Cl.⁴ ............................................. H05K 3/34
[52] U.S. Cl. ....................................... 29/840; 29/827; 174/52 FP; 174/52 PE; 357/70; 357/74
[58] Field of Search ............. 29/840, 827; 174/52 PE, 174/52 FP; 357/70, 74, 80, 71

[56] References Cited

U.S. PATENT DOCUMENTS

| | | | |
|---|---|---|---|
| 3,622,419 | 11/1971 | London | ................................. 29/827 |
| 3,706,840 | 12/1972 | Moyle et al. | .................... 174/52 PE |
| 4,218,701 | 8/1980 | Shirasaki | ........................... 357/70 X |
| 4,264,917 | 4/1981 | Ugon | .............................. 174/52 FP X |
| 4,483,067 | 11/1984 | Parmentier | ................. 174/52 PE X |
| 4,642,716 | 2/1987 | Wakabayashi et al. | .... 174/52 PE X |

FOREIGN PATENT DOCUMENTS 56-33861  4/1981  Japan ............................. 174/52 PE

*Primary Examiner*—Timothy V. Eley
*Assistant Examiner*—Carl J. Arbes
*Attorney, Agent, or Firm*—Finnegan, Henderson, Farabow, Garrett & Dunner

[57] ABSTRACT

A semiconductor device mounted on a printed circuit board is disclosed. The semiconductor device is surrounded by a frame having a stopper portion on the inner wall thereof at a level higher than tops of bonding wires as well as a semiconductor element housed in the frame. An insulating resin is filled in the frame to protect the semiconductor element from external stress and humidity. A method of mounting a semiconductor device on a printed circuit board is further disclosed. In this method a sealing solid resin block is first sustained on a stopper portion provided on the inner wall of a frame surrounding a semiconductor element and bonding wires, and then melted to seal the semiconductor element and bonding wires.

6 Claims, 3 Drawing Sheets

METHOD OF MANUFACTURING A SEMICONDUCTOR DEVICE

This application is a division, of application Ser. No. 06/573,653, filed Jan. 25, 1984 now abandoned.

BACKGROUND OF THE INVENTION (a) Field of the Invention

The present invention relates to an improvement of plastic molding of a semiconductor device.

(b) Description of the Prior Art

In general, semiconductor devices mounted in electronic wristwatches or on memory boards have a structure wherein semiconductor elements are directly mounted on printed circuit boards or ceramic boards. In order to protect the semiconductor elements from external stress or external humidity, they are mounted on the board, and the bonding wires (gold or aluminum thin wires) electrically connect the semiconductor elements with the board wiring pattern. The semiconductor elements mounted on the board are molded by a sealing resin such as epoxy resin or silicone resin. The resin sealing is performed by using a liquid resin or a solid resin. When the solid resin is used, it is heated and melted.

When the liquid resin is used, however, the injection operation cannot be fully automated, and the viscosity of the resin cannot be properly controlled. For these disadvantages, in general, a solid resin is used as shown in FIGS. 1(A) to 1(C). Referring to FIG. 1(A), a desired semiconductor element 3 is mounted on a predetermined region of a circuit board 2 having a wiring pattern 1, and bonding wires 4, are bonded between the semiconductor element 3 and the wiring pattern 1. A frame 5 for surrounding the wiring pattern 1 connected to the semiconductor element 3 through the bonding wires 4 is fixed by an adhesive 8 on the circuit board 2. As shown in FIG. 1(B), a sealing resin block 6 having a predetermined size is placed in the frame 5. Heat is applied to the resin block 6 to form a molded resin portion 6' which seals the semiconductor element 3 and the like, as shown in FIG. 1(C). As a result, a semiconductor device 7 is prepared.

However, in the method using the solid resin block, the resin block 6 is dropped into the frame 5 for a considerably long distance, so that a great impact or load acts on the semiconductor element 3 and the bonding wires 4. As a result, the bonding wires 4 tend to be disconnected or peel off from the bonded metal portions. In order to prevent these problems, it has been proposed to divide the resin block 6 into several pieces. However, in this case, the steps of dividing a resin block into several pieces and of placing the divided pieces into the frame must be added, thereby degrading operability.

SUMMARY OF THE INVENTION

The present invention has been made in consideration of the above situation, and has for its object to provide a method of manufacturing a semiconductor device, and a semiconductor device suitably applied with this method, in which adverse effects are not imposed on a semiconductor element, bonding wires and so on when the semiconductor element is plastic-molded; resin sealing can be easily automated with a high yield; and in which the semiconductor element is effectively protected from external humidity.

According to an aspect of the present invention, there is provided a semiconductor device comprising: a semiconductor element mounted on an insulating circuit board; bonding wires connecting said semiconductor element and a wiring pattern on said circuit board; and a frame which extends on said circuit board so as to surround said bonding wires, said wiring pattern, and said semiconductor element and which has a stopper portion on an inner wall thereof at a level higher than the tops of said bonding wires and said semiconductor element.

According to another aspect of the present invention, there is provided a method of manufacturing a semiconductor device, comprising the steps of: mounting a semiconductor element on a circuit board having a wiring pattern; connecting bonding wires between said semiconductor element and said wiring pattern; placing a frame to extend upward from said circuit board so as to surround said bonding wires, said wiring pattern and said semiconductor element, said frame being provided with a stopper portion on an inner wall thereof at a level higher than tops of said semiconductor element and said bonding wires; placing a sealing solid resin block at an intermediate level of said frame through said stopper portion; and heating and melting said sealing solid resin block to seal said semiconductor element, said bonding wires, and said wiring pattern which are surrounded by said frame.

According to the present invention, the stopper portion is formed on the inner wall of the frame for surrounding the semiconductor element, so that the solid resin block is stopped by the stopper upon being dropped. The solid resin block is then heated and melted in this state to seal the semiconductor element, the bonding wires and so on with the resin, thereby decreasing an impact or load acting on the components to be sealed. As a result, the yield of the semiconductor devices is increased and the semiconductor devices can be automatically plastic-molded. Furthermore, ingress of external humidity can be reduced to the minimum by the presence of the stopper portion.

DETAILED DESCRIPTION OF THE PREFERRED EMBODIMENTS

Preferred embodiments of the present invention will be described with reference to the accompanying drawings.

Figure 2A:
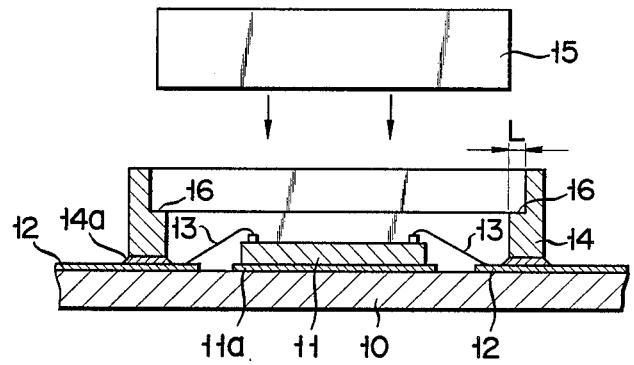
FIGS. 2(A) to 2(C) are sectional views for explaining the steps of sealing a semiconductor device with a resin block according to an embodiment of the present invention.
Figure 2B:
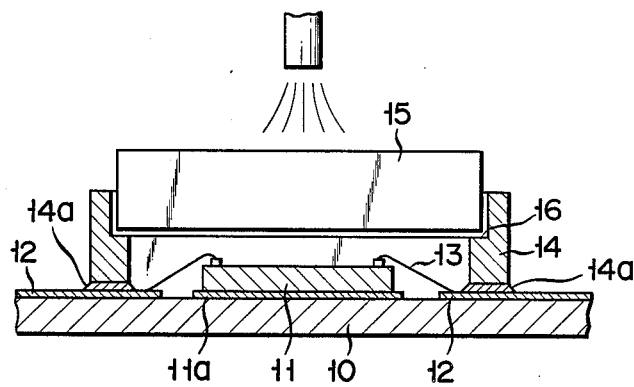
Figure 2C:
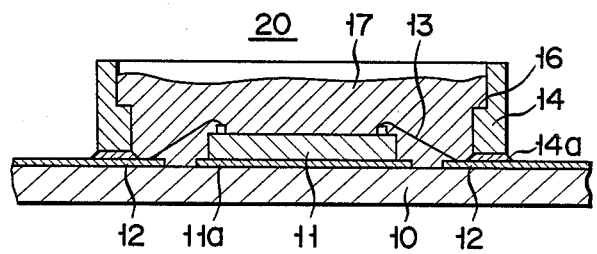

FIGS. 2(A) to 2(C) are sectional views for explaining the steps of manufacturing a semiconductor device according to an embodiment of the present invention. Reference numeral 10 denotes an insulating circuit board made of, for example, ceramic. A semiconductor element 11 is adhered on the upper surface of the circuit board 10 through an adhesive 11a. A predetermined wiring pattern 12 is formed around the semiconductor element 11. Bonding wires 13 such as gold or aluminum thin wires are bonded between the semiconductor element 11 and wiring pattern 12. A frame 14 is adhered by an adhesive 14a on the circuit board 10 so as to surround the wiring pattern 12 connected to the semiconductor element 11 through the bonding wires 13. A stopper portion such as a step 16 is formed on the inner wall surface of the frame 14 so as to support edge portions of a solid resin block 15.

A width L of a support surface of the step 16 is preferably set to be 5 to 30% of a width of the solid resin block 15 so as to firmly support the resin block 15. The level of the step 16 must be higher than tops of the bonding wires 13 and the semiconductor element 11 which are mounted on the circuit board 10. This is because the step 16 must prevent the resin block 15 from abutting against the bonding wires 13 and the semiconductor element 11 when the resin block 15 is placed within the frame 14.

A thermosetting resin such as epoxy resin or a thermophastic resin such as PPS (polyphenylene sulfide) is generally used to form the resin block 15 to be molded in the frame 14.

The resin block 15 is dropped into the frame 14 by an automatic feed apparatus (not shown) and is supported by the frame 14 such that its edges are stopped by the support surfaces of the step 16. As a result, the resin block 15 does not abut against the bonding wires 13 and the semiconductor element 11 and is supported at an intermediate level of the frame 14 (FIG. 2(B)).

As shown in FIG. 2(B), hot air is blown by a heating means such as a hot gas nozzle 18 onto the central upper surface of the resin block 15. The resin block 15 is thus gradually melted to seal the semiconductor element 11, the bonding wires 13 and so on. As a result, a molded resin portion 17 is obtained to seal all the above components, as shown in FIG. 2(C).

Figure 1A:
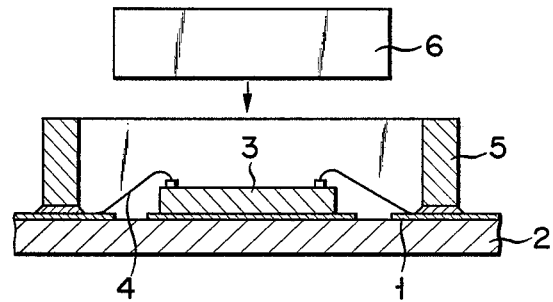
FIGS. 1(A) to 1(C) are sectional views for explaining the steps of sealing a conventional semiconductor device with a resin block.
Figure 1B:
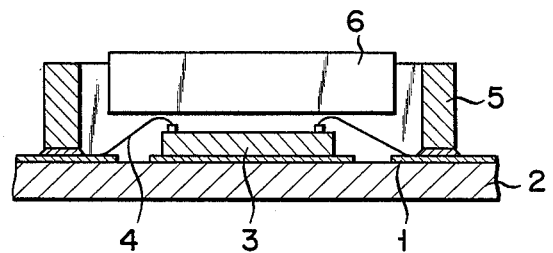
Figure 1C:
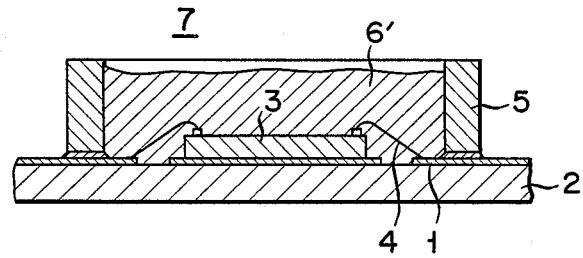

In this manner, the resin block 15 is gradually melted, and the melted resin is gradually brought into contact with the bonding wires 13 and the semiconductor element 11 from their nearest portions. Therefore, unlike the conventional method shown in FIGS. 1(A) to 1(C), the impact and load can be greatly decreased. For this reason, the bonding wires 13 will not be disconnected, and the semiconductor element 11 will not be damaged, thereby greatly improving the reliability of the semiconductor device. Furthermore, since the resin block 15 is supported by step 16, a plurality of units can be prepared each having a structure wherein the resin block 15 is supported on the corresponding step 16. Then, some units can be sequentially subjected to molding as needed. Therefore, the method of the present invention can be readily applied to an automated production line, and hence the working efficiency can be greatly improved. As described above, step 16 is formed on the inner wall surface of the frame 14 and serves as a means for effectively protecting the inner components from external humidity.

In the above embodiment, a thermosetting resin such as silicone resin and epoxy resin is used to form the resin block 15. However, a thermoplastic resin such as polyester resin may be used in place of the thermosetting resin.

Figure 3:
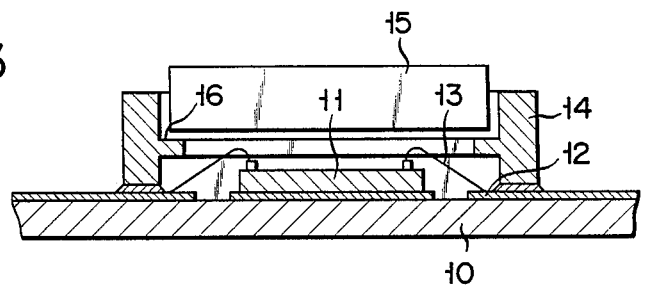
FIGS. 3 and 4 are sectional views of semiconductor devices according to other embodiments of the present invention when resin blocks are placed on corresponding stopper portions, respectively.
Figure 4:
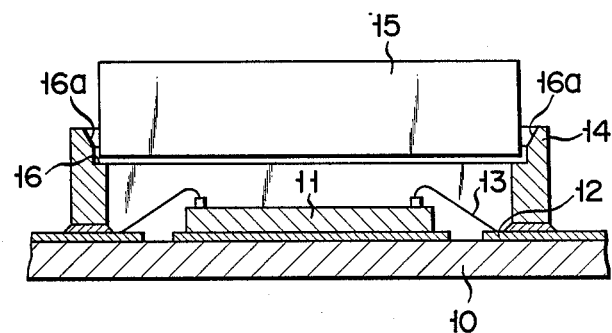
Figure 5:
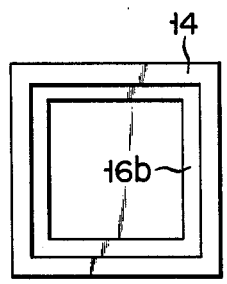
FIGS. 5 to 9 are plan views showing various modifications of frames used in the present invention, respectively.
Figure 6:
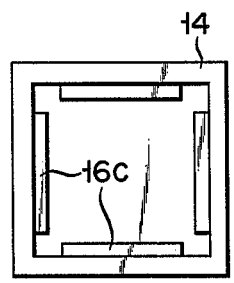
Figure 7:
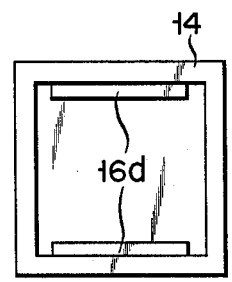
Figure 8:
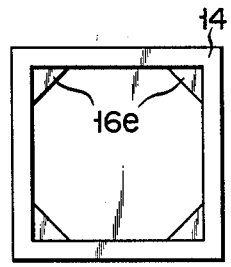
Figure 9:
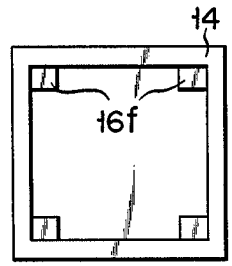

The stopper portion formed on the inner wall surface of the frame 14 may have any shape if the stopper portion can support the resin block 15. For example, as shown in FIG. 3, a collar can be formed on the inner wall surface of the frame 14 to constitute a step 16. Alternatively, as shown in FIG. 4, a step 16 with a taper 16a enlarged upward or only a taper can be formed to support the resin block 15 along the tilt surfaces. Regarding a position for forming such a step 16, a step 16b can be formed in a square shape along all sides of the frame 14, as shown in FIG. 5. As shown in FIG. 6, step portions 16c can be formed except for the four inner corners of the frame 14. A pair of step portions 16d at the opposing sides can be formed on the inner surface of the frame 14, as shown in FIG. 7. Triangular step portions 16e can be formed at four inner corners of the frame 14, as shown in FIG. 8. Furthermore, as shown in FIG. 9, rectangular step portions 16f can be formed at the four inner corners of the frame 14.

What is claimed is:

1. A method of manufacturing a semiconductor device, comprising the steps of:
    mounting a semiconductor element on a circuit board having a wiring pattern;
    connecting bonding wires between said semiconductor element and said wiring pattern;
    positioning a frame to extend upward from said circuit board to surround said bonding wires, said wiring pattern, and said semiconductor element, said frame having an inner wall and a stopper portion supported by said inner wall, said stopper portion being at a level more distant than a furthest portion of said semiconductor element and said bonding wires relative to said circuit board;
    placing a sealing solid resin block onto said stopper portion to hold said resin block in a position spaced from said semiconductor element and said bonding wires; and
    melting said sealing solid resin block to seal said semiconductor element, said bonding wires, and said wiring pattern within said frame.

2. A method according to claim 1, wherein said stopper portion comprises a stepped portion.

3. A method according to claim 1, wherein said stopper portion comprises a collar.

4. A method according to claim 1, wherein said stopper portion comprises a taper which is enlarged at portions of said taper at relatively greater distances from said circuit board than portions of said taper at relatively lesser distances from said circuit board.

5. A method according to claim 1, wherein said stopper portion extends along a portion of said inner wall.

6. A method according to claim 5, wherein said portion of said inner wall extends around the entire circumference of said inner wall.

* * * * *